United States Patent [19]

Beanlands et al.

[11] Patent Number: 5,506,455
[45] Date of Patent: Apr. 9, 1996

[54] ELECTRICAL APPLIANCE WITH REDUCED ELECTRIC FIELD EMISSIONS

[75] Inventors: Peter Beanlands, Chandlers Ford, England; John S. Beeteson, Skelmorlie, Scotland; David Sawdon, South Wonston; Ken G. Smith, Chandlers Ford, both of England

[73] Assignee: International Business Machines Corporation, Armonk, N.Y.

[21] Appl. No.: 417,716

[22] Filed: Apr. 6, 1995

Related U.S. Application Data

[63] Continuation of Ser. No. 59,089, May 5, 1993, abandoned.

[30] Foreign Application Priority Data

Jun. 5, 1992 [GB] United Kingdom ............... 9209786

[51] Int. Cl.$^6$ .................................................. H04N 5/44
[52] U.S. Cl. ...................... 307/10.1; 307/141; 307/142; 439/133; 439/373; 174/103
[58] Field of Search ............................ 307/141, 142, 307/72, 75, 112, 140; 439/133, 373, 846, 299, 328, 346; 174/70 R, 103–104, 105 R; 350/96.1, 96.23; 361/42, 45, 84, 91

[56] References Cited

U.S. PATENT DOCUMENTS

| | | | |
|---|---|---|---|
| 3,649,742 | 3/1972 | Tissot | 174/70 R |
| 4,285,022 | 8/1981 | Lewiner et al. | 361/45 |
| 5,150,442 | 9/1992 | Desmons | 385/101 |
| 5,231,310 | 7/1993 | Oh | 307/142 |

FOREIGN PATENT DOCUMENTS

| | | | |
|---|---|---|---|
| 3923384 | 5/1990 | Germany | H05K 9/00 |
| WO90/01861 | 2/1990 | WIPO . | |

OTHER PUBLICATIONS

IEEE Transactions on Industry Applications, vol. 25, No. 6, Dec. 1989 New York, US, pp. 1093–1101 XP000113006, Warren H. Lewis 'The Use and Abuse of Insulated/Isolated Grounding'.

IRE Wescon Convention Record, vol., 34, Nov. 1990, North Hollywood, US pp. 719–720 XP000227945, Ronald D. Baney 'Cost Effective Noise Reduction in Power Supplies'.

*Primary Examiner*—Peter S. Wong
*Assistant Examiner*—Aditya Krishnan
*Attorney, Agent, or Firm*—Bernard D. Bogdon; Michael J. Buchenhorner

[57] ABSTRACT

An electrical appliance comprises a power supply cable (70) having a first conductor (200) surrounded by a second conductor (210) for supplying electrical power to the appliance from a domestic electricity mains supply, and a connector (490) connected to cable for detachably connecting the conductors of the cable to first and second voltage signals of the electricity mains supply. In operation, the second conductor (210) is connected to the lower of the voltage signals. The second conductor (210) thus acts as a shield in opposition to electric fields radiating from the cable. The shield improves in efficiency as the lower mains voltage signal approaches Ground potential.

11 Claims, 4 Drawing Sheets

ELECTRICAL APPLIANCE WITH REDUCED ELECTRIC FIELD EMISSIONS

This is a continuation of application Ser. No. 08/059,089 filed on May 5, 1993 now abandoned.

BACKGROUND OF THE INVENTION

The present invention relates to reducing electric field emissions from electrical appliances.

Electrical appliances such as Cathode Ray Tube (CRT) displays for television reception or computer visual display output comprise cathode ray tube drive circuits that generate magnetic, electric and electrostatic fields. These fields can radiate from the displays. Conventionally, electric field emissions from CRT displays are split into two bands known as Band I and Band II. Band I extends from 5 Hz to 2 KHz. Band II extends from 2 kHz to 400 kHz. Techniques have been developed to reduce magnetic and electrostatic field emissions from CRT displays but not to reduce electric field emissions.

In use, a conventional CRT display radiates an electric field in the Band I from its mains power cable connecting the display to the mains electricity supply. The electric field is radiated because the mains voltage signals on the Live and Neutral conductors are unbalanced. In a CRT display with conventional three wire ("Live" or "Line", "Earth" or "Ground", and "Neutral" or "Return") mains power connection, the electric field emissions can be significantly reduced by shielding the mains power cable with electrically conductive sleeving connected to Earth. However, in a CRT display with conventional, two wire ("Live" or "Line" and "Neutral" or "Return"), double insulated, mains power connection, there is no earth to which electrically conductive sleeving may be connected.

SUMMARY OF THE INVENTION

In accordance with the present invention, there is now provided an electrical appliance comprising a power supply cable having a first conductor surrounded by a second conductor for supplying electrical power to the appliance from a domestic electricity mains supply, and a connector connected to cable for detachably connecting the conductors of the cable to first and second voltage signals of the electricity mains supply.

The present invention stems from a realisation that the electric field emission from a mains power cable can be reduced by surrounding the conductor carrying the higher "Line" mains voltage signal with the conductor carrying the lower "Return" mains voltage signal. The surrounding conductor thus acts as a shield in opposition to electric fields radiating from the cable. The shield improves in efficiency as the lower mains voltage signal approaches Ground potential.

Preferably, the electrical appliance comprises polarising means for securing connection, via the connector, of the second conductor to the lower of the first and second voltage signals.

In some countries, the connector can be a conventional three pin mains plug with the polarising means comprising the disconnected Earth pin. In other countries, the connector may be a symmetrical two pin mains plug. Therefore, in a preferred embodiment of present invention, the polarising means comprises: a switch for alternating connection of the first and second voltage signals between the first and second conductors; a sensor for detecting an electric field radiating from the cable; a memory for storing first and second sensor outputs respectively generated by connection of the first voltage signal to the first and second conductors alternately; and a comparator responsive to the sensor outputs stored in the memory for configuring the switch to connect the voltage signals to the conductors to produce the electric field corresponding to the lower of the sensor outputs.

The switch preferably comprises logic for, in response to a reset signal from a manually operable switch, connecting the first voltage signal to the first conductor and the second voltage signal to the second conductor during a first period, connecting the second voltage signal to the first conductor and the first voltage signal to the second conductor during a second period subsequent to the first period, and thereafter connecting the voltages to the conductors as a function of the comparator output.

The switch can comprise a double pole double throw relay for selectively connecting contacts of the connector to the conductors of the cable as a function of the logic. For simplicity, the memory can comprise first and second sample and hold circuits. The sensor can comprise an antenna extending along a length of the cable and an amplifier for amplifying signals detected by the antenna. The logic, memory, comparator, and amplifier may advantageously be implemented by compact integrated circuit electronics and may thus be housed in the connector without requiring significant enlargement of the connector.

In another preferred embodiment of the present invention, the polarising means comprises: a sensor for detecting an electric field radiating from the cable; and an indicator for indicating the electric field strength detected by the sensor. The indicator may be a liquid crystal display meter, light emitting diode meter, mechanical meter, or the like. This advantageously permits a user to measure the relative radiated electrical field strengths corresponding to the two possible orientations of a two pin plug and thus to select the orientation corresponding to the lowest electric field emission.

In a preferred embodiment of the present invention, the electrical appliance comprises an electrically conductive housing connected to the second conductor and substantially enclosing the appliance to effectively extend the shield.

It will be appreciated that an electrical appliance of the present invention may be a CRT display.

It will also be appreciated that the present invention extends to power connection apparatus for supplying electrical power from a domestic electricity mains supply to an electrical appliance, the apparatus comprising a power supply cable having a first conductor surrounded by a second conductor, and a connector connected to cable for detachably connecting the conductors of the cable to first and second voltage signals of the electricity mains supply.

Viewing a second aspect of the present invention, there is provided a method of reducing electric field emissions from an electrical appliance, the method comprising: connecting a first voltage signal to a first electrical conductor of a power supply cable of the appliance and a second voltage signal to a second electrical conductor of the power supply cable, the second conductor surrounding the first conductor; measuring a first electric field radiating from the cable; connecting the first voltage signal to the second conductor and the second voltage signal to the first conductor; measuring a second electric field radiating from the cable; and setting connection of the first and second voltages to the first and second conductors to generate the lower of the first and second electric fields.

BRIEF DESCRIPTION OF THE DRAWINGS

Preferred embodiments of the present invention will now be described with reference to the accompanying drawings in which.

DESCRIPTION OF THE ILLUSTRATIVE EMBODIMENT(S)

Figure 1:
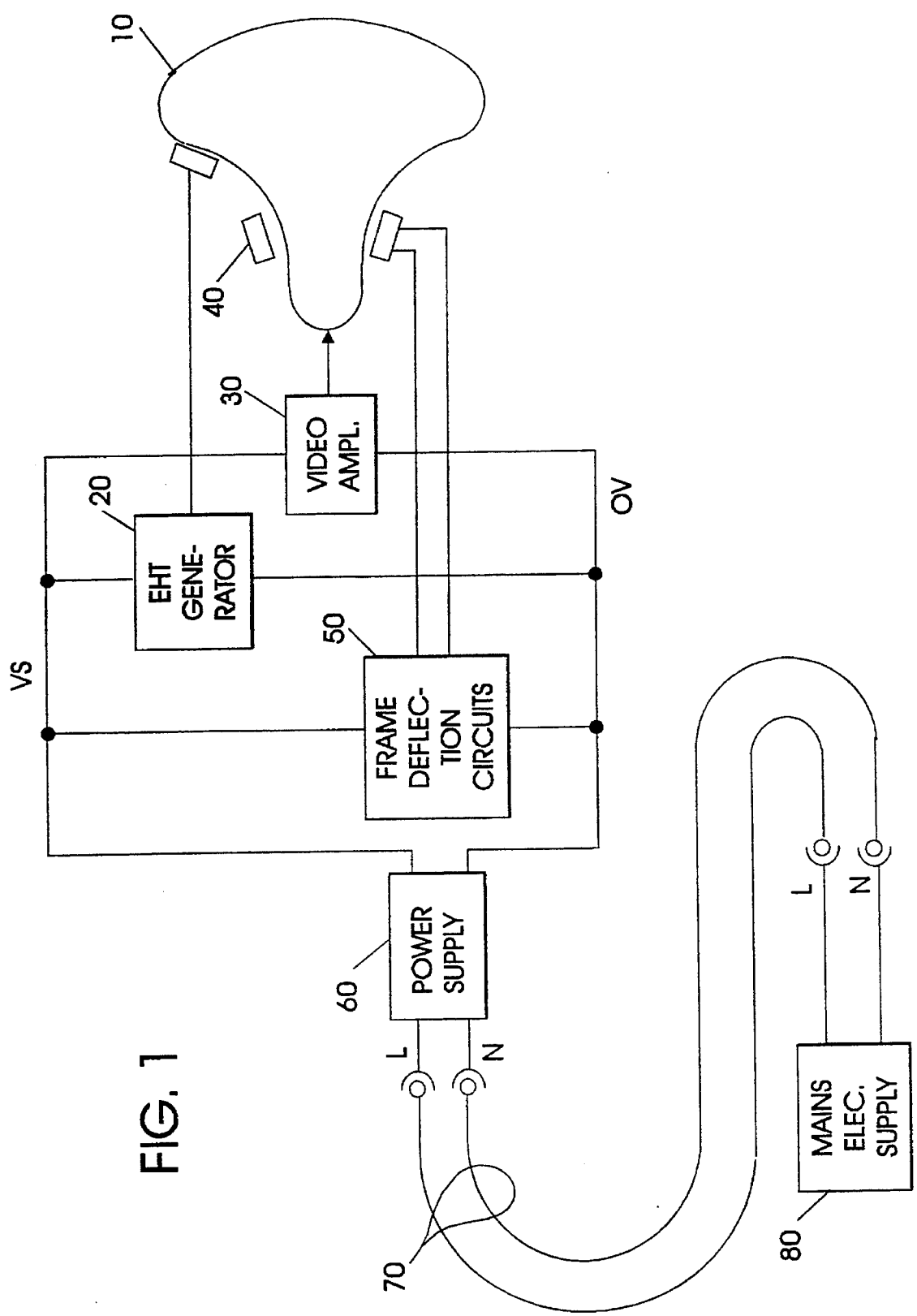
FIG. 1 is a block diagram of a CRT display.

Referring first to FIG. 1, a CRT display comprises a CRT 10 connected to an Extra High Tension voltage (EHT) generator 20 and a video amplifier 30. Line and frame deflection coils 40 are disposed around the neck of the CRT 10. The deflection coils are connected to line and frame deflection circuits 50. A power supply 60 is connected, via supply lines, Vs and 0 V, to the EHT generator 20, video amplifier 30 and deflection circuits 50. In use, the power supply 60 is connected to higher and lower ("Live" or "Line" and "Neutral" or "Return") mains voltage signals, L and N, of a domestic mains electricity supply 80 via a dual conductor, double insulated power cable 70 and conventional plug and socket connection. In the UK, the Live voltage signal is maintained at 240 Vac and the Neutral voltage signal is maintained at 0 Vac.

In operation, power supply 60 draws electrical power from the mains supply to satisfy the power demands of EHT generator 20, video amplifier 30, and deflection circuits 50. Power supply 60 is usually a switch mode power supply synchronised in operation to the line deflection frequency for good noise rejection. EHT generator 20 generates an electric field within CRT 10 for accelerating electrons in one or more beams towards the screen of CRT 10. Line and frame deflection circuits 50 generate varying magnetic fields for scanning the electron beams across CRT screen 10 in a raster pattern. Electric fields radiating from the CRT display in use generally include fields produced by the deflection circuits 50, fields produced through modulation of the EHT voltage by video signal content, fields radiated from the power supply 60, and fields radiated from power cable 70.

The magnetic deflection fields generated by deflection circuits 50 are produced by sawtooth current signals flowing in line and frame deflection coils 40. The voltage signals produced across deflection coils 40 are therefore pulse trains with pulse lengths corresponding to and coincident with the shorter lengths of the line and frame sawtooth signals. The pulses of the frame voltage signal typically peak at several tens of volts, but the pulses of the line voltage signal may be around 1000 volts in amplitude. The Fourier series corresponding to the line and frame voltage signals are therefore rich in high order harmonics of the line and frame scan frequencies respectively.

EHT generator 20 typically comprises rectifying and smoothing components connected to a step up secondary winding of a transformer driven by the line deflection circuit. The output impedance of EHT generator 20 is usually, unless EHT generator 20 is regulated, sufficiently high that changes in the current loading of CRT 10 through changes in picture content modulate the EHT voltage produced across the secondary winding at harmonics of the line and frame frequencies.

Figure 2B:
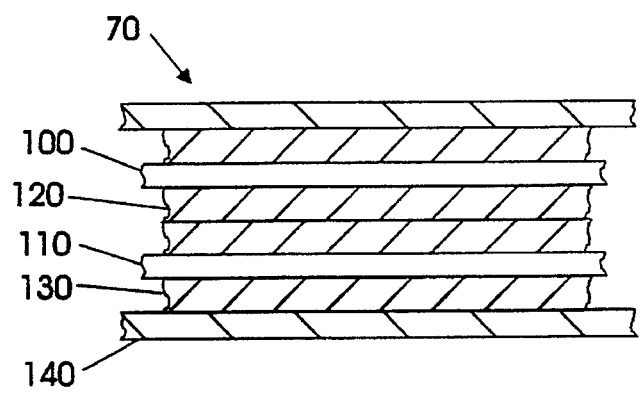
FIG. 2b is a cross sectional view from the plane AA of the cable shown in FIG. 2a in the direction or the arrows.
Figure 2A:
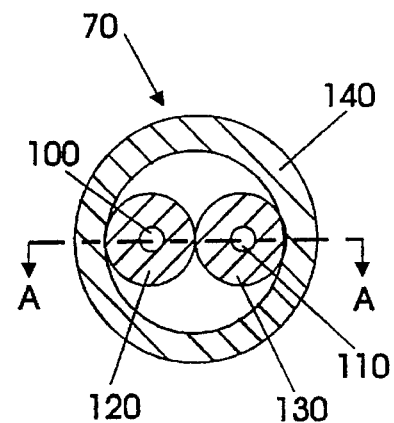
FIG. 2a is an end view of a conventional dual conductor mains power cable.

Referring to FIGS. 2a and b, power cable 70 conventionally comprises first and second conductors 100, 110 electrically insulated from each other by first and second electrically non-conductive sleeves 120, 130. Each conductor is in the form of a multiple strand wire. The conductors 100, 110 clad in their respective sleeves 120, 130 are held adjacent each other within an electrically non-conductive jacket 140. The jacket 140 and sleeves 120, 130 thus provide two separate layers of insulation between the conductors 100, 110 and the exterior of the cable 70. In operation, as aforementioned, one of the conductors carries the generally higher, Live mains voltage signal (240 V ac in the UK, for example) and the other carries the generally lower, Neutral mains voltage signal (OV ac in the UK). Because the voltage signals on the conductors 100, 110 are unbalanced, a net electric field is radiated from power cable 70 at the frequency of the Live voltage signal (50 Hz in the UK).

Figure 3B:
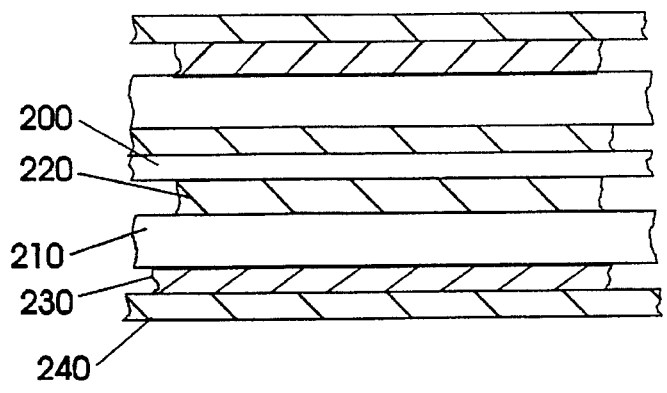
FIG. 3b is a cross sectional view from the plane BB of the cable shown in FIG. 3b in the direction of the arrows.
Figure 3A:
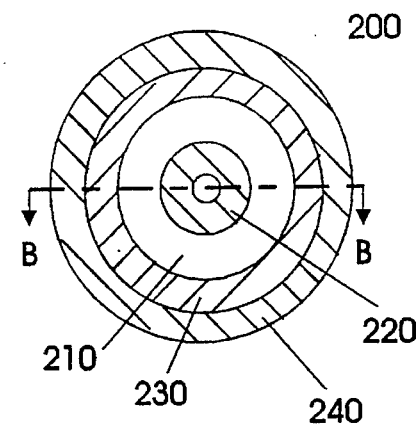
FIG. 3a is an end view of a dual conductor mains power cable for electric field emission reduction apparatus of the present invention.

Referring now to FIGS. 3a and b, in electric field reduction apparatus of the present invention, the power cable 70 comprises a first conductor 200 surrounded by a second conductor 210. A first sleeve 220 of electrically non-conductive material insulates first conductor 200 from second conductor 210. The outer surface of second conductor 210 is clad by a second sleeve 230 of electrically non-conductive material. Double insulation is provided by a jacket 240 of electrically non-conductive material coating the outer surface of second sleeve 230.

In use according to the present invention, the Live voltage signal is connected to first conductor 200 and the Neutral voltage signal is connected to second conductor 210. Because the Neutral voltage signal is generally lower, second conductor 210 acts as a screen to prevent radiation from the cable of electric fields produced by the voltage signal on first conductor 200.

Figure 4:
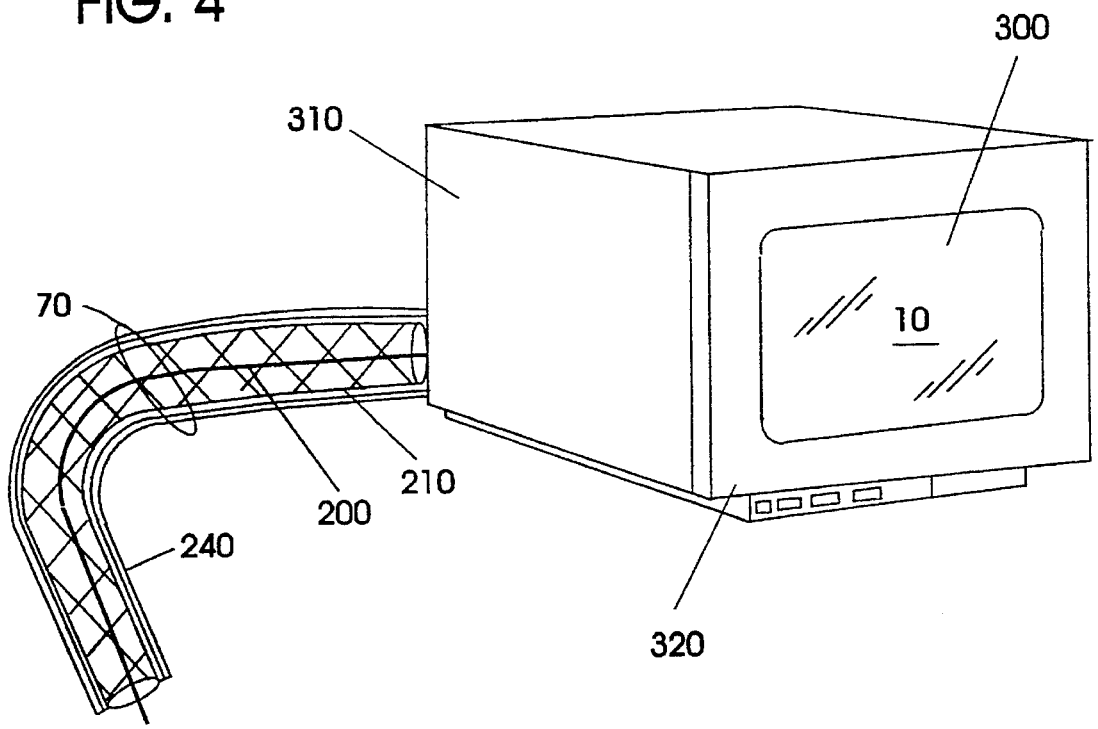
FIG. 4 illustrates a CRT display comprising electric field emission reduction apparatus of the present invention.

Referring now to FIG. 4, in a preferred example of a CRT display of the present invention, CRT screen 10 is coated with a transparent electrically conductive material 300 which is, in turn, coated with a layer of electrically non-conductive material for safety. CRT 10 is mounted in a bezel 300 having an electrically conductive inner coating 320 connected to the conductive screen coating 300. The exterior of the bezel 320 is electrically insulated from its inner coating, again, for safety. The drive circuitry of the display is housed in an electrically conductive jacket 310 connected to the inner coating of the bezel 320 and encased in a non conductive cover (not shown) again for safety. In accordance with the present invention, the jacket is connected to second conductor 210 of power cable 70 shown in FIGS. 3a and b.

If power cable 70 is connected to the mains via a conventional three pin plug, the Earth pin, remaining disconnected, can be used as a polariser to ensure that the first conductor is always connected to the Live voltage signal and the second conductor is always connected to the Neutral voltage signal. However, if cable 70 is connected to the mains via a conventional symmetrical two pin plug, it will be appreciated that, conventionally, connection of the lower mains voltage signal to second conductor 210 cannot be guaranteed. Preferred examples of the present invention therefore comprise a polarising circuit for ensuring that second conductor 210 is always connected to the lower mains voltage signal.

Figure 5:
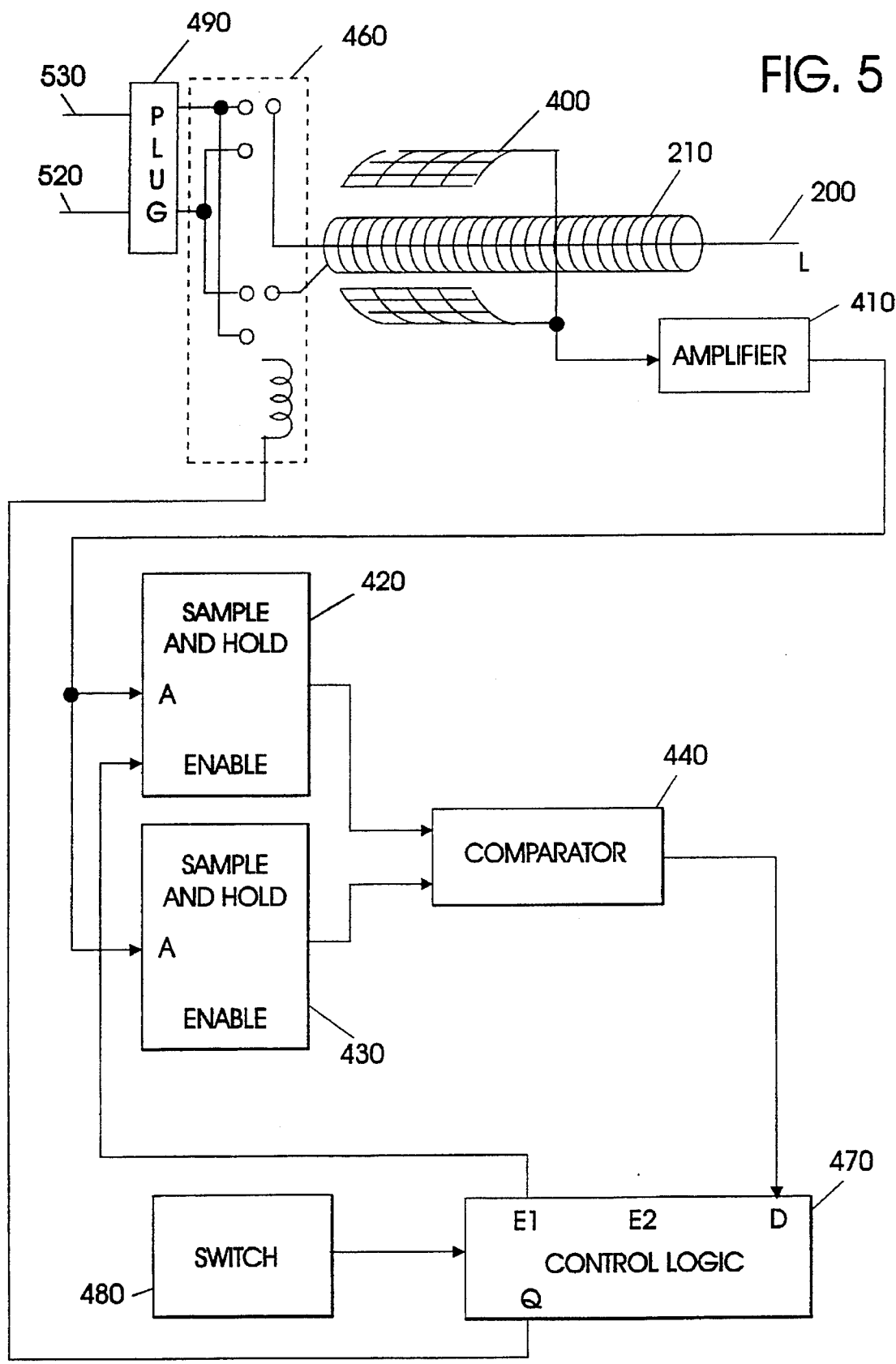
FIG. 5 is a block diagram of a polarising circuit for electric field emission reduction apparatus of the present invention.

Referring now to FIG. 5, in a preferred example of the present invention, the polarising circuit comprises an antenna 400 connected to an amplifier 410. The output of amplifier 410 is connected to the inputs of two sample/hold circuits 420, 430. The outputs of the sample/hold circuits 420, 430 are connected to the inputs of a comparator 440. The output of comparator 440 is connected to the data input of control logic 470. Control logic 470 has a switch output Q connected to the control input of a double pole double throw selector switch 460 such as a relay. The switch 460 has poles 461, 462 respectively connected to conventional first and second pins 520, 530 of a two pin plug 490 and terminals 540, 550 connectable to conductors 200, 210 of power cable 70 respectively. Control logic 470 also has enable outputs E1 and E2 respectively connected to control inputs of sample and hold circuits 420, 430. In addition, control logic 470 has a reset input R connected to a manually operable switch 480. It will be appreciated that the circuit may be integral to the plug 490 for attachment to the cable, or housed separately in an adaptor unit for receiving a plug to which the cable is attached. It will be appreciated that switch 480 may be part of a conventional mains on/off switch.

To initiate operation of the circuit, a reset signal is manually applied, via switch 480, to the reset input of the logic 470. In response to the reset signal, the logic 470, via switch output Q configures switch 460 to connect, for a first period, the first pin of the plug to the second conductor 210 of the cable and the second pin to the first conductor 200. Simultaneously, the logic 470, during the first period, enables, via enable signal E1, sample/hold circuit 420 to store a sample of the output of amplifier 410. During the first period, the logic 470, via enable signal E2, disables sample/hold circuit 430 from responding to the output of amplifier 410. After the first period, and during a second, subsequent period, the logic 470 toggles the switch output Q to configure switch 460 to connect the second pin of the plug to the second conductor 210 and to connect the first pin of the plug to the first conductor 200. Simultaneously, the logic 470 toggles enable signals E1 and E2 to enable sample/hold circuit 430 to store a sample of the output of the amplifier 410 and to disable sample/hold circuit 420. The output of the comparator 440 is a logic level indicative of the difference between relative magnitudes of the samples stored in the sample/hold circuits 420, 430. For example, the comparator may be configured to produce a low output if the sample stored in sample/hold circuit 420 is greater in magnitude than that stored in sample/hold circuit 430, and a high output otherwise. Alternatively, the comparator may be configured to produce a high output if the sample stored in sample/hold circuit 420 is greater in magnitude than that stored in sample/hold circuit 430, and a low output otherwise. After the second period, in response to the output from the comparator, the logic 440 sets switch output Q to configure switch 460 to connect conductors 200, 210 to pins in the arrangement that provided the lowest output from the amplifier 410 and therefore the lowest electric field emission from the cable.

Figure 6:
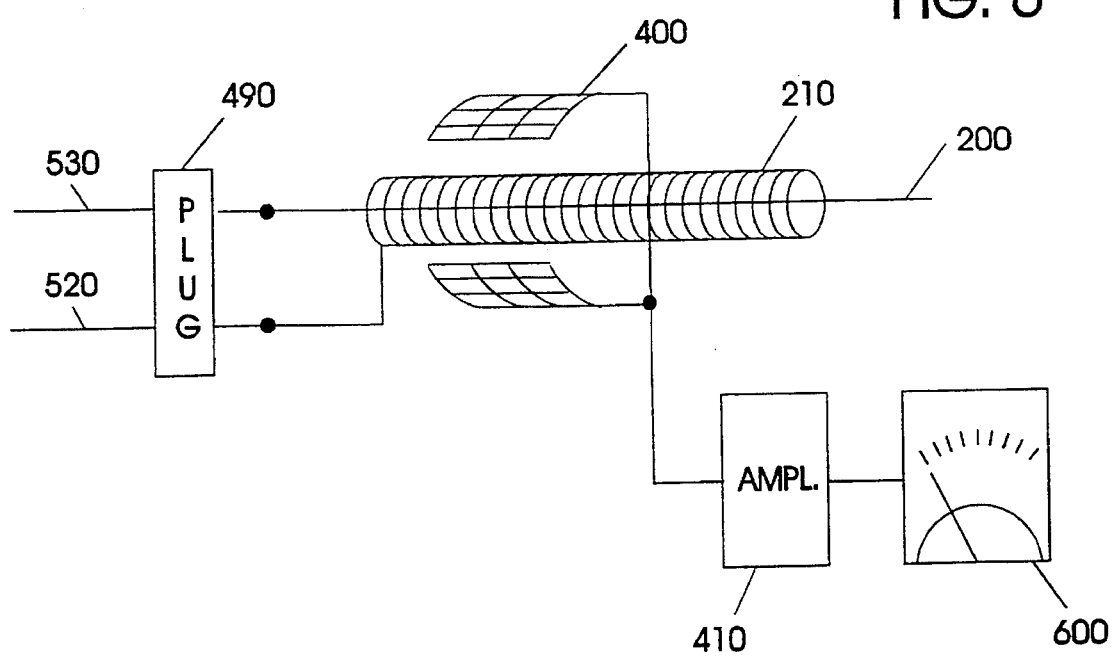
FIG. 6 is a block diagram of another polarising circuit for electric field emission reduction apparatus of the present invention.

Referring now to FIG. 6, in another preferred example of the present invention, the polarising circuit again comprises antenna 400 connected to amplifier 410. The first and second pins 520, 530 of two pin plug 490 are connectable to conductors 200, 210 of power cable 70 respectively. The output of amplifier 410 is, however, connected to an electric field strength indicator 600. Indicator 600 may be a liquid crystal display meter, light emitting diode meter, mechanical meter, or the like.

In operation, a user inserts plug 490 into a receiving mains electricity socket one way round and switches the display on. Antenna 400 senses the electric field radiating from the cable. Amplifier 410 amplifies the signal detected by the antenna. Indicator 600 provides a visual measurement of the strength of the radiating electric field. The user the switches the display off, removes the plug from the socket, reinserts it the other way round, and switches the display on again. Indicator 600 provides another visual measurement of the strength of the radiating electric field. The user can then align the plug with the socket to produce the lowest electric field emission by comparing the two measured electric field strengths.

Preferred examples of the present invention have been hereinbefore described with reference to a CRT display. However, it will be appreciated that the present invention is equally applicable to other electrical appliances.

What is claimed is:

1. An electrical appliance comprising:

a power supply cable, for supplying electrical power to the appliance from a domestic electricity mains supply, the power supply cable comprising a first conductor; and a second conductor, surrounding the first conductor;

a connector connected to the cable for detachably connecting the first and second conductors of the cable to first and second voltage signals of the electricity mains supply; and polarising means, connected to the connector, for assisting connection of the second conductor to the lower of the first and second voltage signals.

2. The electrical appliance as claimed in claim 1, wherein the polarising means comprises:

a switch for alternating connection of the first and second voltage signals between the first and second conductors;

a sensor for detecting an electric field radiating from the cable;

a memory for storing first and second sensor outputs respectively generated by connection of the first voltage signal to the first and second conductors alternately; and a comparator, responsive to the sensor outputs stored in the memory, for configuring the switch to connect the first and second voltage signals to the first and second conductors to produce the electric field corresponding to the lower of the sensor outputs.

3. The electrical appliance as claimed in claim 2, wherein the switch comprises logic, responsive to a reset signal, for connecting the first voltage signal to the first conductor and the second voltage signal to the second conductor during a first period, connecting the second voltage signal to the first conductor and the first voltage signal to the second conductor during a second period, the second period occurring subsequent to the first period, and after the second period connecting the voltages to the conductors as a function of the comparator output.

4. The electrical appliance as claimed in claim 3, wherein the switch comprises a double pole double throw relay for selectively connecting contacts of the connector to the first and second conductors of the cable in response to an output from the logic.

5. The electrical appliance as claimed in claim 4, wherein the memory comprises first and second sample and hold circuits.

6. The electrical appliance as claimed in claim 5, wherein the sensor comprises an antenna for detecting signals radiating from the cable extending along a length of the cable and an amplifier for amplifying the signals detected by the antenna.

7. The electrical appliance as claimed in claim 1, wherein the polarising means comprises:

a sensor for detecting an electric field radiating from the cable; and an indicator for indicating the strength of the electric field detected by the sensor.

8. The electrical appliance as claimed in claim 6, comprising an electrically conductive housing connected to the second conductor and substantially enclosing the electrical appliance.

9. The electrical appliance as claimed in claim 6 further comprising a CRT display.

10. A power connection apparatus for supplying electrical power from a domestic electricity mains supply to an electrical appliance, the apparatus comprising a power supply cable comprising a first conductor, and a second conductor surrounding the first conductor;

a connector connected to the cable for detachably connecting the conductors of the cable to first and second voltage signals of the electricity mains supply; and polarising means, connected to the connector, assisting connection of the second conductor to the lower of the first and second voltage signals.

11. A method of reducing electric field emissions from an electrical appliance, the method comprising the steps of:

connecting a first voltage signal to a first electrical conductor of a power supply cable of the electrical appliance and a second voltage signal to a second electrical conductor of the power supply cable, the second conductor surrounding the first conductor;

measuring a first electric field radiating from the cable;

connecting the first voltage signal to the second conductor and the second voltage signal to the first conductor;

measuring a second electric field radiating from the cable; and setting connection of the first and second voltages to the first and second conductors to generate the lower of the first and second electric fields.

* * * * *